United States Patent
Wada

(10) Patent No.: US 10,009,048 B2
(45) Date of Patent: Jun. 26, 2018

(54) HIGH-FREQUENCY CIRCUIT AND TRANSMISSION AND RECEPTION CIRCUIT USING HIGH-FREQUENCY CIRCUIT

(71) Applicant: Murata Manufacturing Co., Ltd., Kyoto (JP)

(72) Inventor: Takaya Wada, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days. days.

(21) Appl. No.: 15/179,351

(22) Filed: Jun. 10, 2016

(65) Prior Publication Data

US 2016/0285482 A1    Sep. 29, 2016

Related U.S. Application Data

(63) Continuation of application No. PCT/JP2014/083223, filed on Dec. 16, 2014.

(30) Foreign Application Priority Data

Dec. 20, 2013  (JP) ................. 2013-263630

(51) Int. Cl.
*H04B 1/00* (2006.01)
*H04B 1/04* (2006.01)
(Continued)

(52) U.S. Cl.
CPC .......... *H04B 1/0458* (2013.01); *H03H 7/12* (2013.01); *H03H 7/38* (2013.01); *H03H 7/40* (2013.01); *H03H 7/463* (2013.01); *H04B 1/18* (2013.01)

(58) Field of Classification Search
CPC .......... H04B 1/0458; H04B 1/18; H03H 7/38; H03H 7/463; H03H 7/12; H03H 7/40
See application file for complete search history.

(56) References Cited

U.S. PATENT DOCUMENTS

2005/0068146 A1* 3/2005 Jessie .............. H01F 17/0006
336/200
2005/0277399 A1* 12/2005 Kronberger ............ H04B 1/18
455/280
(Continued)

FOREIGN PATENT DOCUMENTS

JP    2001-512642 A    8/2001
JP    2004-194097 A    7/2004
(Continued)

OTHER PUBLICATIONS

International Search Report issued in Application No. PCT/JP2014/083223 dated Feb. 17, 2015.
(Continued)

*Primary Examiner* — Ping Hsieh
(74) *Attorney, Agent, or Firm* — Pearne & Gordon LLP

(57) ABSTRACT

The present disclosure provides a high-frequency circuit including a matching circuit capable of adjusting the input/output impedance of a high-frequency device to an optimal value, even if the high-frequency device includes a circuit element whose input/output impedance varies upon the variation in the operating frequency, and provides a transmission and reception circuit including the high-frequency circuit. The high-frequency circuit includes a first high-frequency device, a second high-frequency device electrically connected to the first high-frequency device, and a matching circuit connected between the first high-frequency device 1 and the second high-frequency device. At least one of the first high-frequency device 1 and the second high-frequency device includes a variable device and has a changeable operating frequency. The matching circuit includes at least one variable device capable of performing impedance matching in accordance with operating frequen-
(Continued)

cies of the first high-frequency device and the second high-frequency device.

12 Claims, 10 Drawing Sheets

(51) Int. Cl.
    *H03H 7/40*     (2006.01)
    *H03H 7/46*     (2006.01)
    *H04B 1/18*     (2006.01)
    *H03H 7/12*     (2006.01)
    *H03H 7/38*     (2006.01)

(56) References Cited

U.S. PATENT DOCUMENTS

| | | | |
|---|---|---|---|
| 2012/0314811 A1* | 12/2012 | Goldfarb | H03D 7/1441 375/316 |
| 2014/0220913 A1* | 8/2014 | Coumou | H03H 7/40 455/114.3 |
| 2015/0048898 A1* | 2/2015 | Gaynor | H03H 7/40 333/124 |

FOREIGN PATENT DOCUMENTS

| | | |
|---|---|---|
| JP | 2009-545240 A | 12/2009 |
| JP | 2011-521508 A | 7/2011 |
| WO | 2013/027580 A1 | 2/2013 |

OTHER PUBLICATIONS

Written Opinion issued in Application No. PCT/JP2014/083223 dated Feb. 17, 2015.

* cited by examiner

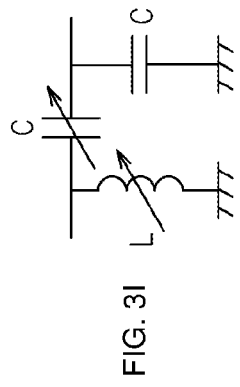
FIG. 3I
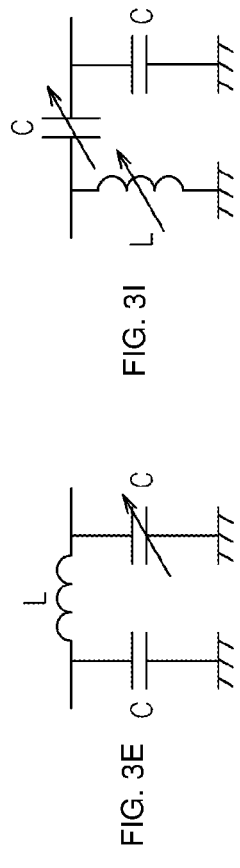
FIG. 3A
FIG. 3B
FIG. 3C
FIG. 3D
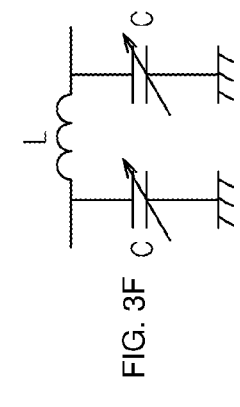
FIG. 3E
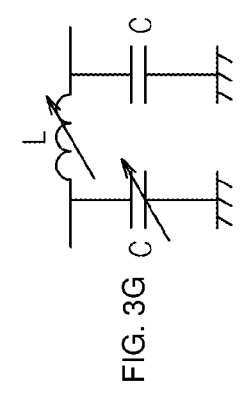
FIG. 3F
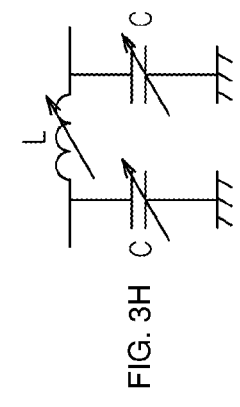
FIG. 3G
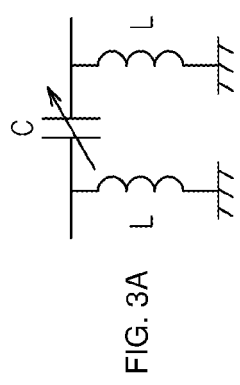
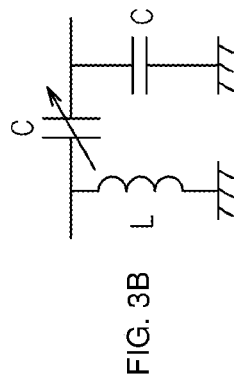
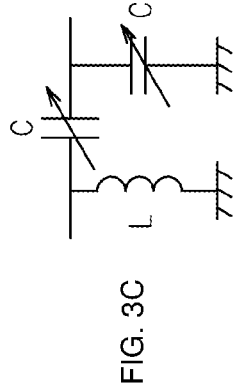
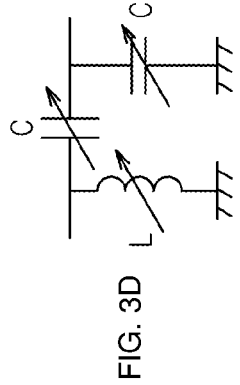
FIG. 3H

HIGH-FREQUENCY CIRCUIT AND TRANSMISSION AND RECEPTION CIRCUIT USING HIGH-FREQUENCY CIRCUIT

BACKGROUND

Technical Field

The present disclosure relates to a high-frequency circuit including a matching circuit capable of adjusting the input/output impedance of a high-frequency device to an optimal value even if an operating frequency varies, and relates to a transmission and reception circuit using the high-frequency circuit.

In electronic components, in the case where electrical signals on a transmitter side in a transmission path have a constant power, if the output impedance of a transmitter circuit and the input impedance of a receiver circuit are made to be equal to each other, the receiver circuit obtains the maximum power. Accordingly, it is necessary to make those impedances equal to each other (hereinafter referred to as "to perform impedance matching") for efficient transmission.

In the case where impedance matching is not performed sufficiently, the receiver circuit cannot obtain the desired maximum output. In a high-frequency circuit, in particular, a reflection wave generated in the transmission path is superposed on a traveling wave, which may result in an increase in a transmission loss, generation of noise, and the like.

In an apparatus such as a receiver or measuring instrument handling a weak signal, a matching circuit is provided in a front-end circuit, thereby reducing the noise figure of the whole apparatus and improving reception sensitivity or measurement sensitivity. For example, Patent Document 1 discloses full duplex radio equipment in which a variable BPF (band pass filter) is provided for each of a transmitter and a receiver. In the full duplex radio equipment disclosed in Patent Document 1, even if a transmission signal is reflected by an antenna owing to impedance mismatching, a correction signal that is the anti-phase signal of the reflection signal and that has the same level as the reflection signal is generated and added to a reception signal, thereby enabling most of the reflection signal to be removed from the reception signal received by the receiver and preventing degradation in reception sensitivity.

Patent Document 1: Japanese Unexamined Patent Application Publication No. 2004-194097

BRIEF SUMMARY

However, there has been a problem as follows. In the circuit configuration of the full duplex radio equipment disclosed in Patent Document 1, if the operating frequency of any of the variable BPFs varies, the output impedance of the variable BPF also varies. Accordingly, impedance matching cannot be performed sufficiently between the variable BPF and a circulator. In fact, in circuit elements other than the variable BPFs, impedance matching is performed by, for example, fixing input/output impedance values to 50Ω. However, an optimal input/output impedance value of a variable BPF varies upon the variation in an operating frequency. Accordingly, impedance matching cannot be performed sufficiently, which may result in generation of various characteristics (e.g., increase in transmission loss and degradation in reception sensitivity). That is, there has been a problem as follows. Even if a high-frequency device that can be adapted to various operating frequencies is realized, it is not possible to embody a high-frequency circuit adapted to various operating frequencies unless a matching circuit that connects the high-frequency device and another device to each other is adapted to various operating frequencies.

The present disclosure has been made in view of the above problems. The present disclosure provides a high-frequency circuit including a matching circuit capable of adjusting the input/output impedance of a high-frequency device to an optimal value even if the high-frequency device is a high-frequency device including a circuit element whose input/output impedance varies upon the variation in the operating frequency, and to provide a transmission and reception circuit using the high-frequency circuit.

A high-frequency circuit according to the present disclosure includes a first high-frequency device, a second high-frequency device electrically connected to the first high-frequency device, and a matching circuit connected between the first high-frequency device and the second high-frequency device. At least one of the first high-frequency device and the second high-frequency device includes a variable device and has a changeable operating frequency. The matching circuit includes at least one variable device capable of performing impedance matching in accordance with operating frequencies of the first high-frequency device and the second high-frequency device.

The above configuration includes the first high-frequency device, the second high-frequency device electrically connected to the first high-frequency device, and the matching circuit connected between the first high-frequency device and the second high-frequency device. At least one of the first high-frequency device and the second high-frequency device includes a variable device and has a changeable operating frequency. The matching circuit includes at least one variable device capable of performing impedance matching in accordance with operating frequencies of the first high-frequency device and the second high-frequency device. Accordingly, it is possible to reliably perform impedance matching by using the variable device in the matching circuit even if the operating frequency of the first high-frequency device and/or the operating frequency of the second high-frequency device vary. In addition, it is possible to minimize a transmission loss between the first high-frequency device and the second high-frequency device.

In the high-frequency circuit according to the present disclosure, at least one of the first high-frequency device and the second high-frequency device can be a variable filter.

In the above configuration, since at least one of the first high-frequency device and the second high-frequency device is a variable filter, it is possible to cause an operating frequency to vary by using the first high-frequency device and/or the second high-frequency device. Even if the operating frequency varies, it is possible to reliably perform impedance matching by using the variable device in the matching circuit. In addition, it is possible to minimize a transmission loss between the first high-frequency device and the second high-frequency device.

In the high-frequency circuit according to the present disclosure, the first high-frequency device can be a variable filter, and the second high-frequency device can be a power amplifier.

In the above configuration, since the first high-frequency device is a variable filter and the second high-frequency device is a power amplifier, even if the operating frequencies of the power amplifier and the variable filter vary, it is possible to reliably perform impedance matching by using the variable device in the matching circuit and to suppress the variation in signals output from the power amplifier.

A transmission and reception circuit according to the present disclosure includes two high-frequency circuits that are connected to the first high-frequency device, and each of the high-frequency circuits is the above-described high-frequency circuit.

The first high-frequency device is a wide-band circulator.

An antenna is connected to the first high-frequency device.

One of the high-frequency circuits functions as a transmitter circuit, and the other of the high-frequency circuits functions as a receiver circuit.

In the above configuration, two high-frequency circuits are connected to the first high-frequency device, and each of the high-frequency circuits is the above-described high-frequency circuit. The first high-frequency device is a wideband circulator. An antenna is connected to the first high-frequency device. One of the high-frequency circuits functions as a transmitter circuit, and the other of the high-frequency circuits functions as a receiver circuit. Accordingly, even if the antenna is shared between the transmitter circuit and the receiver circuit, it is possible to reliably perform impedance matching in accordance with the variation in the operating frequency of the variable filter and to suppress degradation in reception characteristics.

The above configuration includes a first high-frequency device, a second high-frequency device electrically connected to the first high-frequency device, and a matching circuit connected between the first high-frequency device and the second high-frequency device. At least one of the first high-frequency device and the second high-frequency device includes a variable device and has a changeable operating frequency. The matching circuit includes at least one variable device capable of performing impedance matching in accordance with the operating frequencies of the first high-frequency device and the second high-frequency device. Accordingly, it is possible to reliably perform impedance matching by using the variable device in the matching circuit even if the operating frequency of the first high-frequency device and/or the operating frequency of the second high-frequency device vary. In addition, it is possible to minimize a transmission loss between the first high-frequency device and the second high-frequency device.

BRIEF DESCRIPTION OF THE SEVERAL VIEWS OF THE DRAWINGS

FIGS. 3A-3I illustrate exemplary configurations of a matching circuit according to the first embodiment of the present disclosure.

DETAILED DESCRIPTION

Embodiments of the present disclosure are now described below in detail with reference to the drawings.

First Embodiment

Figure 1:
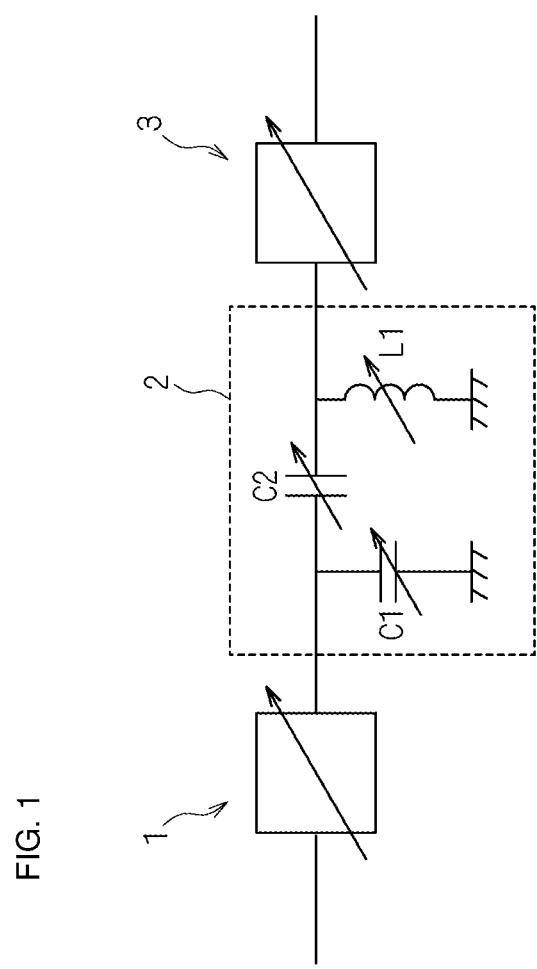
FIG. 1 is a schematic diagram illustrating a configuration of a high-frequency circuit according to a first embodiment of the present disclosure.

FIG. 1 is a schematic diagram illustrating a configuration of a high-frequency circuit according to a first embodiment of the present disclosure. As illustrated in FIG. 1, a matching circuit 2 capable of adjusting the input/output impedances of a first high-frequency device 1 and a second high-frequency device 3 whose operating frequencies can be set in a wide frequency band is connected in the high-frequency circuit according to the first embodiment.

In the first embodiment, it is assumed that the first high-frequency device 1 and the second high-frequency device 3 operate in a plurality of frequency bands defined by the 3GPP standard, that is, a wide frequency band.

As a high-frequency device whose operating frequency can be set in a wide frequency band, there is a variable element, typically a variable filter whose operating frequency can be set to a predetermined frequency by setting the element value of a variable device included in the variable filter to a predetermined value. Here, the variable device means a device such as a variable-capacitance diode whose capacitance value is variable. The variable device is, for example, a variable inductor whose inductance can be switched by using a switching IC.

In a case where such a variable element is used in a high-frequency circuit, it is not necessary to cause the operating frequencies of both of the first high-frequency device 1 and the second high-frequency device 3 to vary, and it is sufficient that the operating frequency of either one is variable. This is because the matching circuit 2 performs impedance matching in any case. For example, only the first high-frequency device 1 may be a variable filter, only the second high-frequency device 3 may be a variable filter, or both may be variable filters.

The matching circuit 2 adjusts the input/output impedances of the first high-frequency device 1 and the second high-frequency device 3 to match constantly even if the input/output impedance of the first high-frequency device 1 and the input/output impedance of the second high-frequency device 3 vary upon the variation in the operating frequency of the first high-frequency device 1 and/or the operating frequency of the second high-frequency device 3. That is, the matching circuit 2 can minimize a transmission loss that results from mismatching between the first high-frequency device 1 and the second high-frequency device 3 even if the input/output impedances of the first high-frequency device 1 and/or the second high-frequency device 3 vary. Variable devices included in the matching circuit 2 set the frequency used for impedance matching (the operating frequency of the matching circuit 2) in accordance with the operating frequency of the first high-frequency device 1 and/or the operating frequency of the second high-frequency device 3. For example, the matching circuit 2 illustrated in FIG. 1 is an LC π-circuit including three variable devices, which are variable capacitors C1 and C2 and a variable coil L1, and these three variable devices set the frequency used for impedance matching.

The first high-frequency device 1 and/or the second high-frequency device 3 whose operating frequencies are variable can operate alone in a wide band. However, the transmission loss increases owing to mismatching between the first high-frequency device 1 and the second high-frequency device 3, and the circuit on the whole becomes unable to operate in a wide band in the following cases: the case where the first high-frequency device 1 and the second high-frequency device 3 are connected to each other without necessarily the matching circuit 2 interposed therebetween; and the case where, even if the first high-frequency device 1 and the second high-frequency device 3 are connected to each other with the matching circuit 2 interposed therebetween, the operating frequency band of the matching circuit 2 used is not a wide band and where, depending on the operating frequency, the matching circuit 2 is incapable of making absolute values of the input/output impedances of the first high-frequency device 1 and the second high-frequency device 3 substantially equal to each other.

In the first embodiment, the matching circuit 2 itself includes variable devices and is capable of causing impedance characteristics to vary in accordance with the frequency. Accordingly, the matching circuit 2 can perform impedance matching by adjusting the impedance values in such a manner that the input/output impedances of the first high-frequency device 1 and the second high-frequency device 3 match constantly even if the operating frequency of the first high-frequency device 1 and/or the operating frequency of the second high-frequency device 3 vary. Therefore, it is possible to minimize the transmission loss between the first high-frequency device 1 and the second high-frequency device 3.

Note that the frequency band in which a high-frequency device operates is not limited to a particular band, but is typically about 600-900 MHz as a relatively low frequency band or about 1500-2200 MHz or about 2300-3500 MHz as a relatively high-frequency band.

In addition, the combination of the first high-frequency device 1 and the second high-frequency device 3 is not limited to the case where operating frequencies of both devices are variable (e.g., the case of variable BPFs). FIGS. 2A-2D illustrate exemplary combinations of the first high-frequency device 1 and the second high-frequency device 3 in the high-frequency circuit according to the first embodiment of the present disclosure.

Figure 2A:
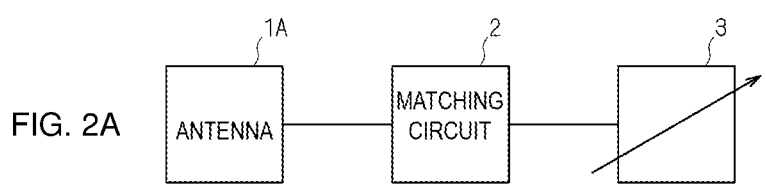
FIGS. 2A-2D illustrate exemplary combinations of a first high-frequency device and a second high-frequency device in the high-frequency circuit according to the first embodiment of the present disclosure.
Figure 2B:
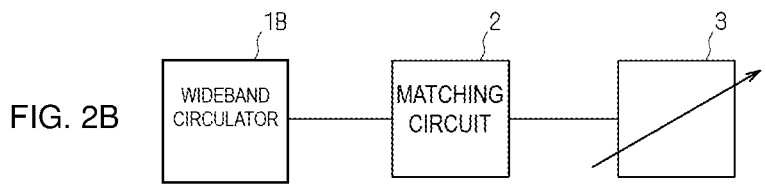

In the example illustrated in FIG. 2A, an antenna 1A is employed as the first high-frequency device 1. In this case, it is possible to maintain a high quality of a signal received by the antenna 1A. In the example illustrated in FIG. 2B, a wide-band circulator 1B is employed as the first high-frequency device 1. In this case, a transmitter circuit and a receiver circuit share an external antenna with the wide-band circulator 1B interposed between the transmitter circuit and the receiver circuit. Thus, a transmission signal and a reception signal can be isolated from each other. Note that the wide-band circulator 1B has a wide-band bandpass characteristic. That is, the wide-band circulator 1B has such a bandpass characteristic that enables a plurality of bands to pass among frequency bands defined by the 3GPP standard.

Figure 2C:
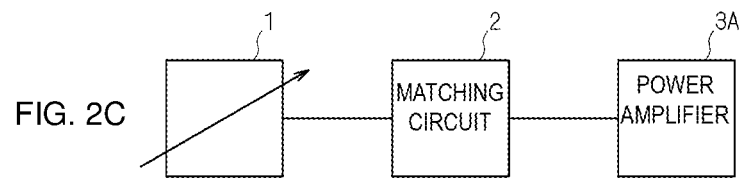
Figure 2D:
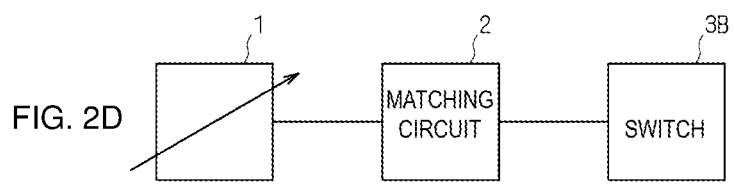

In the example illustrated in FIG. 2C, a power amplifier 3A is employed as the second high-frequency device 3. In this case, the efficiency of the power amplifier 3A increases, and a power signal output from the power amplifier 3A is stabilized. In the example illustrated in FIG. 2D, a switch 3B is employed as the second high-frequency device 3. In this case, it is possible to perform impedance matching between the first high-frequency device 1 and a plurality of second high-frequency devices 3 connected to the switch 3B by switching the connection by using the switch 3B.

In addition, the matching circuit 2 is not limited to the LC π-circuit having the configuration as illustrated in FIG. 1. FIGS. 3A-3I illustrate exemplary configurations of the matching circuit 2 according to the first embodiment of the present disclosure.

As illustrated in FIGS. 3A to 3I, for the LC π-circuit alone, configurations of various combinations can be assumed. In addition, the matching circuit 2 is not limited to the LC π-circuit either. FIGS. 4A-4H illustrate other exemplary configurations of the matching circuit 2 according to the first embodiment of the present disclosure.

Figures 4A, 4B, 4C, 4D, 4E, 4F, 4G, 4H:
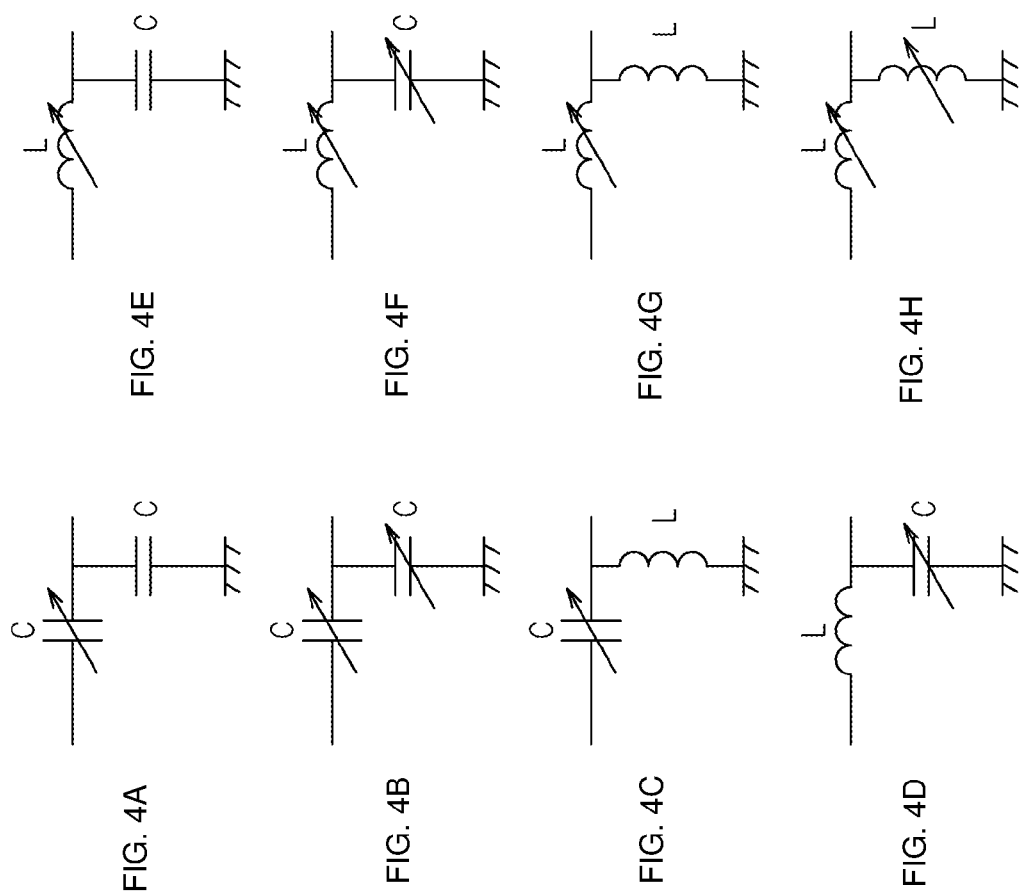
FIGS. 4A-4H illustrate other exemplary configurations of the matching circuit according to the first embodiment of the present disclosure.

The matching circuit 2 may be, for example, a circuit including capacitors C only as illustrated in FIGS. 4A and 4B or a circuit including a capacitor C and a coil L as illustrated in FIGS. 4C to 4F. Alternatively, the matching circuit 2 may be a circuit including coils L only as illustrated in FIGS. 4G and 4H.

Figure 5B:
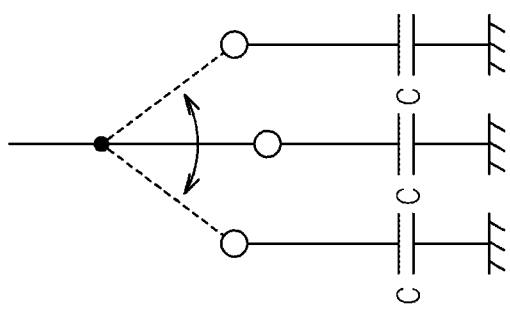
FIGS. 5A and 5B illustrate exemplary configurations in each of which a switch is used for the matching circuit according to the first embodiment of the present disclosure.
Figure 5A:
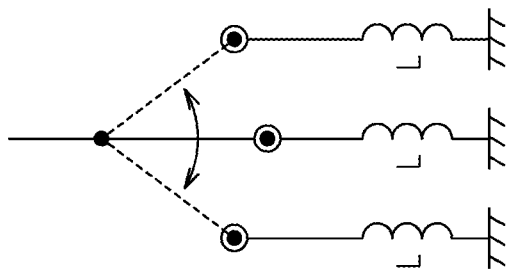

It is needless to say that the matching circuit 2 is not necessarily configured as illustrated in FIGS. 3A and 4H so as to cause the operating frequency to vary continuously and may be configured so as to cause the operating frequency to vary stepwise by using a switch or the like. FIGS. 5A and 5B illustrate exemplary configurations in each of which a switch is used for the matching circuit 2 according to the first embodiment of the present disclosure.

FIG. 5A illustrates a configuration in which a plurality of (three in FIG. 5A) coils L having different inductances are provided and in which the connection is switched by using a switch. FIG. 5B illustrates a configuration in which a plurality of (three in FIG. 5B) capacitors C having different capacitances are provided and in which the connection is switched by using a switch. In this manner, the operating frequency can be caused to vary stepwise by switching the connection by using a switch, and the function of the matching circuit 2 is enabled.

As described above, according to the first embodiment, the matching circuit 2 whose operating frequency is variable and including at least one variable device is provided between the first high-frequency device 1 and the second high-frequency device 3 that operate in the same frequency band or different frequency bands. Accordingly, it is possible to reliably perform impedance matching by using the variable device in the matching circuit 2 even if the operating frequency of the first high-frequency device 1 and/or the operating frequency of the second high-frequency device 3 vary. In addition, it is possible to minimize the transmission loss between the first high-frequency device 1 and the second high-frequency device 3.

Second Embodiment

Figure 6:
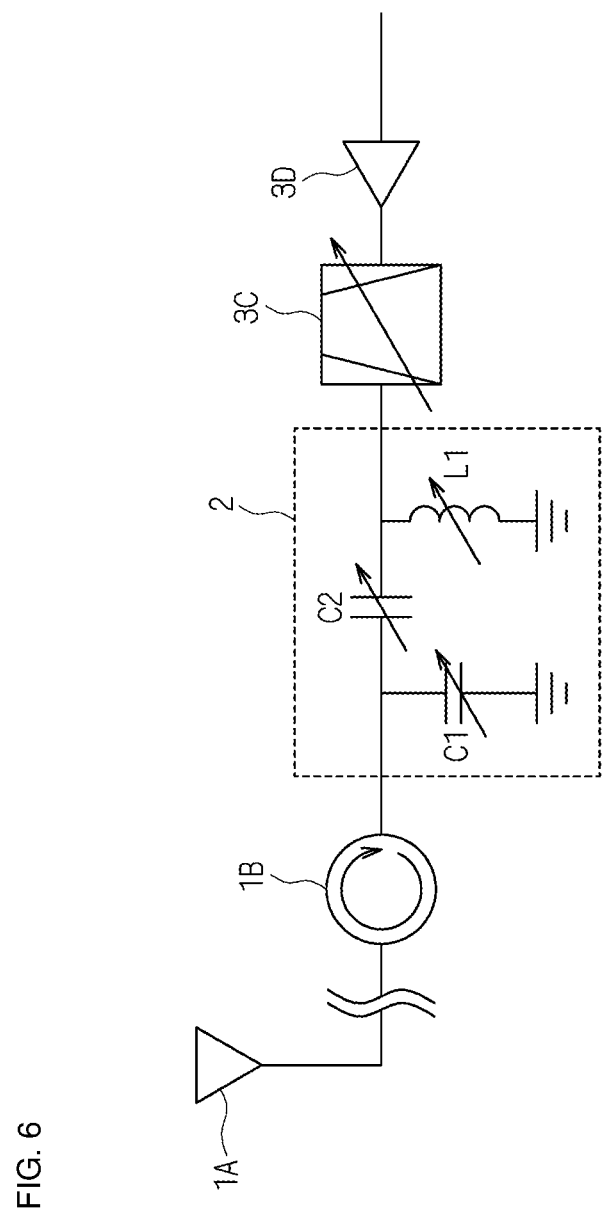
FIG. 6 is a schematic diagram illustrating a configuration of a high-frequency circuit according to a second embodiment of the present disclosure.

FIG. 6 is a schematic diagram illustrating a configuration of a high-frequency circuit according to a second embodiment of the present disclosure. As illustrated in FIG. 6, in the high-frequency circuit according to the second embodiment, a wide-band circulator (or isolator) 1B and a variable filter 3C are respectively employed as the first high-frequency device 1 and the second high-frequency device 3. In the same manner as in the first embodiment, the matching circuit 2 is connected between the wide-band circulator 1B and the variable filter 3C. A receiver circuit that receives signals from the antenna 1A is formed in such a manner that the antenna 1A and a low-noise amplifier 3D are respectively connected to the wide-band circulator 1B and the variable filter 3C.

In the case where the operating frequency varies owing to the operation of the variable filter 3C handling a change in the frequency of a reception signal, it is possible to adjust the input/output impedances of the wide-band circulator 1B and the variable filter 3C in such a manner that the absolute values of the impedance values are substantially equal to each other constantly by causing, to vary, the capacitances of capacitors C or the inductance of a coil L in the matching circuit 2, which is an LC π-circuit. That is, variable devices included in the matching circuit 2 perform impedance matching. For example, the matching circuit 2 illustrated in FIG. 6 is an LC π-circuit including three variable devices, which are variable capacitors C1 and C2 and a variable coil L1, and these three variable devices perform impedance matching.

Figure 7A:
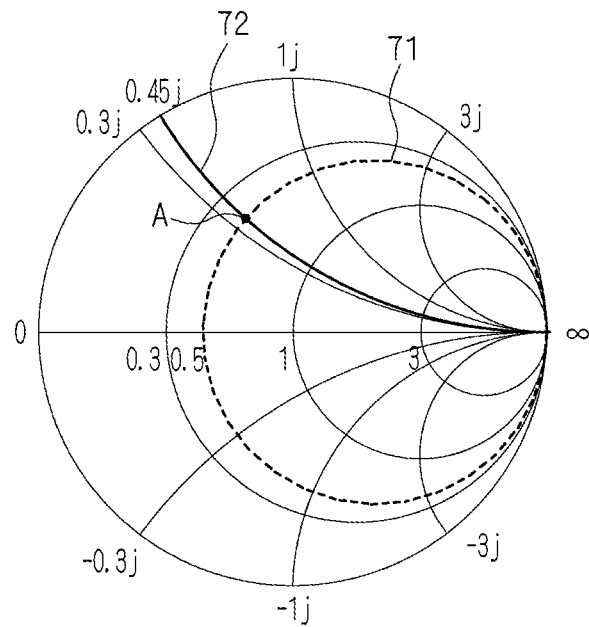
FIGS. 7A and 7B illustrate Smith charts of an input impedance of a circulator in the high-frequency circuit according to the second embodiment of the present disclosure.
Figure 7B:
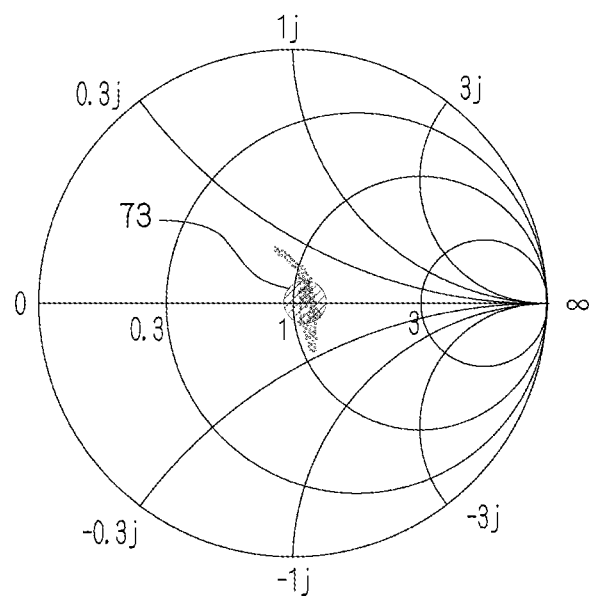

In the second embodiment, the wide-band circulator 1B is connected to an output side of the variable filter 3C, and thus, the input impedance of the wide-band circulator 1B is likely to converge to a predetermined impedance value. FIGS. 7A and 7B illustrate Smith charts of the input impedance of the wide-band circulator 1B in the high-frequency circuit according to the second embodiment of the present disclosure.

The Smith chart in FIG. 7A illustrates the relationship between an impedance and a reflection coefficient on a complex plane. For example, to plot an impedance Z=25Ω+j22.5Ω on a Smith chart, first, the impedance Z is normalized by using a characteristic impedance of 50Ω (the normalized impedance is 1Ω), Z=0.5+j0.45 is obtained, and a circle 71 of a constant resistance of a real part of 0.5 is drawn. Then, a circle 72 of a constant reactance of 0.45 is drawn. The intersection of the two circles 71 and 72 is a point A representing the impedance Z.

The impedance Z obtained by using the same method in the case where the operating frequency varies owing to the variable filter 3C is plotted in FIG. 7B. As is clear from FIG. 7B, in the plot of the impedance Z, the impedance Z is concentrated in a certain area 73 and a periphery thereof regardless of a change in the load of the antenna 1A. Accordingly, even if the output impedance varies markedly, it is possible to easily perform impedance matching by using the matching circuit 2, thereby enabling extension of the band used by the high-frequency circuit on the whole.

As described above, according to the second embodiment, it is possible to perform impedance matching by adjusting, by using the matching circuit 2, the impedance values in such a manner that the input/output impedances of the first high-frequency device 1 and the second high-frequency device 3 match constantly even if the operating frequency of the first high-frequency device 1 and/or the operating frequency of the second high-frequency device 3 vary markedly. Therefore, it is possible to extend the band used by the high-frequency circuit on the whole.

Third Embodiment

Figure 8:
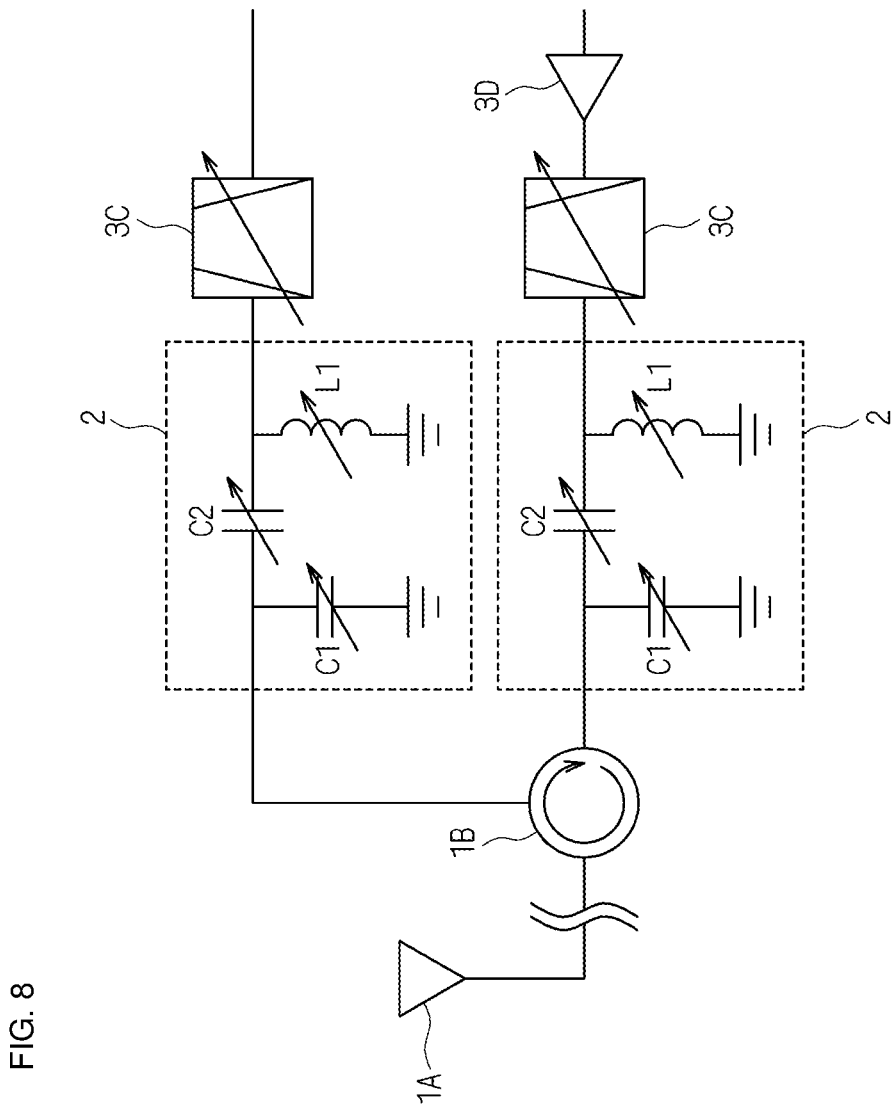
FIG. 8 is a schematic diagram illustrating a configuration of a transmission and reception circuit according to a third embodiment of the present disclosure.

FIG. 8 is a schematic diagram illustrating a configuration of a transmission and reception circuit according to a third embodiment of the present disclosure. As illustrated in FIG. 8, in the transmission and reception circuit according to the third embodiment, two high-frequency circuits, which are the high-frequency circuits described in the first embodiment and the second embodiment, are connected to each other with the wide-band circulator 1B, which is the first high-frequency device 1, interposed therebetween.

That is, one of the high-frequency circuits functions as a transmitter circuit, and the other of the high-frequency circuits functions as a receiver circuit. The transmitter circuit and the receiver circuit share the antenna 1A with the wide-band circulator 1B interposed therebetween, thereby being capable of transmitting and receiving signals.

Each of two matching circuits 2 is connected between the wide-band circulator 1B and a corresponding one of variable filters 3C. Accordingly, it is possible to adjust the input/output impedances of the wide-band circulator 1B and the variable filter 3C to optimal impedance values constantly by causing, to vary, the capacitances of capacitors C or the inductance of the coil L in each of the matching circuits 2, which are LC π-circuits, even if the operating frequency varies owing to a change in the load of the antenna 1A. Variable devices included in each of the matching circuits 2 perform impedance matching.

Figure 9:
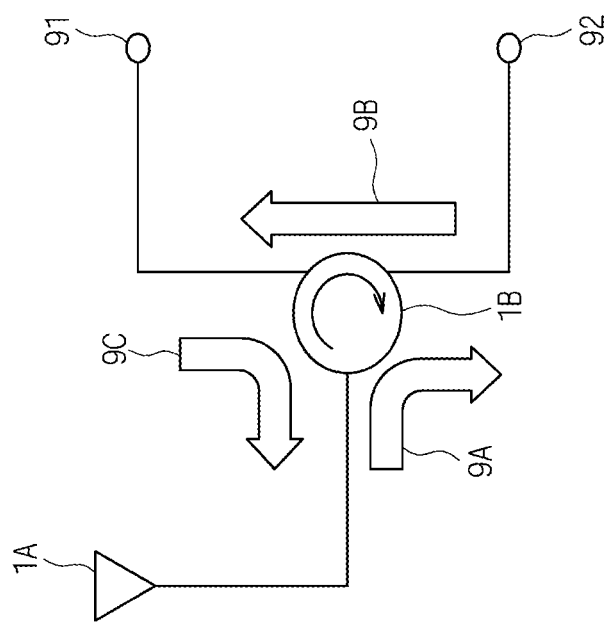
FIG. 9 is a schematic diagram illustrating how the transmission and reception circuit according to the third embodiment of the present disclosure performs isolation.

In addition, in the third embodiment, the wide-band circulator 1B is connected to an output side of the variable filter 3C, and thus, the input impedance of the wide-band circulator 1B is more likely to converge to a predetermined impedance value. FIG. 9 is a schematic diagram illustrating how the transmission and reception circuit according to the third embodiment of the present disclosure performs isolation.

As illustrated in FIG. 9, in the transmission and reception circuit according to the third embodiment, the wide-band circulator 1B effectively isolates a reflection wave from the antenna 1A to a transmission port 92 as indicated by reference numeral 9A, isolates a reflection wave from the transmission port 92 to a reception port 91 as indicated by reference numeral 9B, and isolates a reflection wave from the reception port 91 to the antenna 1A as indicated by reference numeral 9C. Accordingly, it is possible to suppress a decrease in S/N ratios at the transmission port 92 and the reception port 91, thereby enabling maintenance of high transmission and reception sensitivity.

Figure 10:
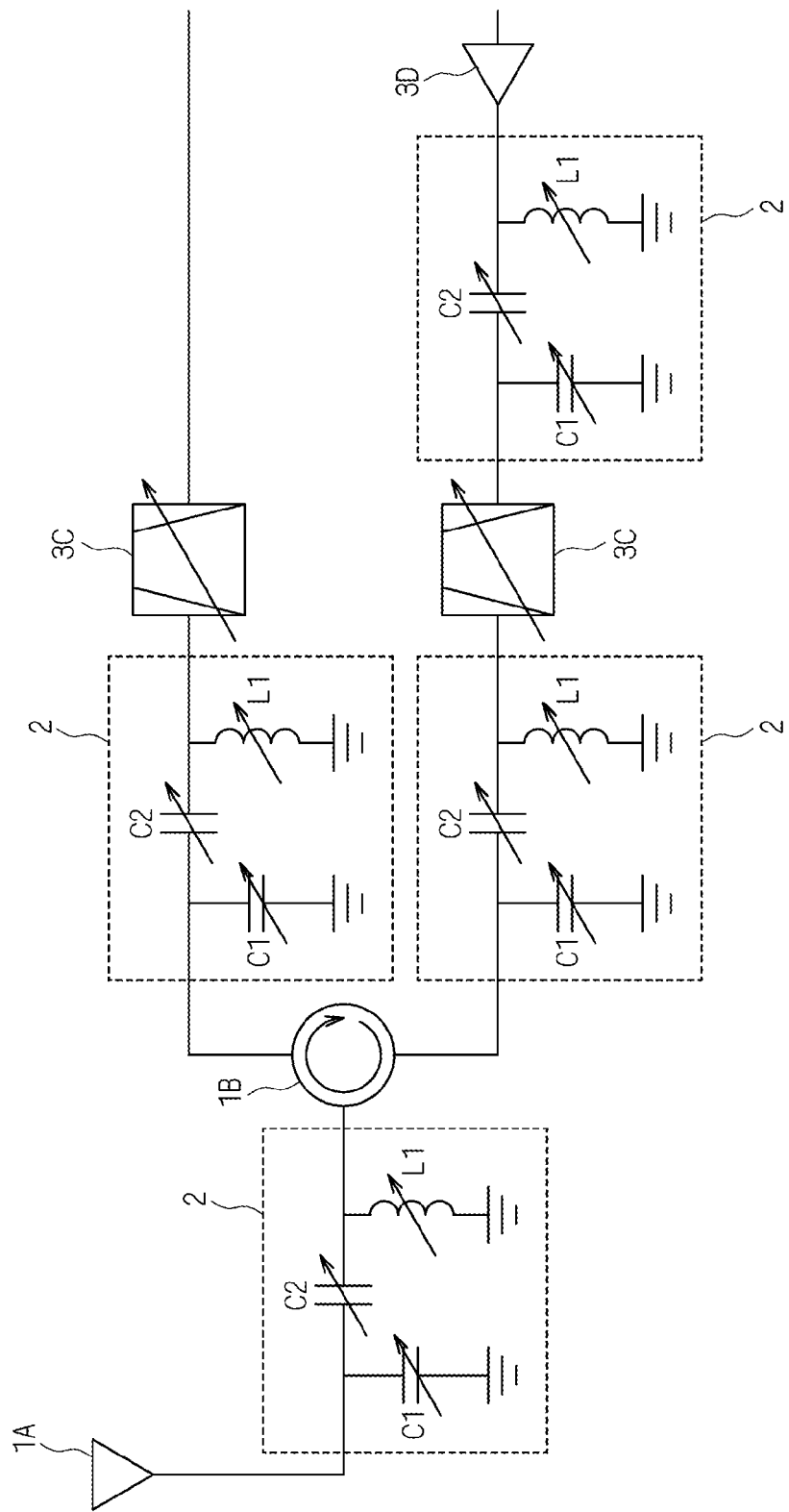
FIG. 10 is a schematic diagram illustrating another configuration of the transmission and reception circuit according to the third embodiment of the present disclosure.

Note that the matching circuit 2 may be connected between the antenna 1A and the wide-band circulator 1B in order to increase the reception sensitivity, which is more likely to be influenced. FIG. 10 is a schematic diagram illustrating another configuration of the transmission and reception circuit according to the third embodiment of the present disclosure.

As illustrated in FIG. 10, a matching circuit 2 is connected between the antenna 1A and the wide-band circulator 1B. Accordingly, variable devices in the matching circuit 2 can reliably perform impedance matching, whereby degradation in reception characteristics (reception sensitivity) can be suppressed even if the antenna 1A is shared between the transmitter circuit and the receiver circuit.

As described above, according to the third embodiment, it is possible to reliably perform impedance matching in accordance with the variation in the operating frequency of the variable filter 3C and to suppress degradation in reception characteristics even if the antenna 1A is shared between the transmitter circuit and the receiver circuit.

It is needless to say that the above-described embodiments can be modified in different manners without necessarily departing from the scope of the present disclosure. For example, the connection position of the matching circuit 2 is not limited to the position illustrated in the above-described embodiments. It is sufficient to connect the matching circuit 2 at a position where impedance matching is desired, such as a position between the variable filter 3C and the power amplifier 3A (see FIGS. 2A-2D) or a position between the variable filter 3C and the low-noise amplifier 3D (see FIG. 10).

REFERENCE SIGNS LIST 1 first high-frequency device
2 matching circuit
3 second high-frequency device
1A antenna
1B wide-band circulator
3A power amplifier
3B switch
3C variable filter
3D low-noise amplifier

The invention claimed is:

1. A high-frequency circuit comprising:
a first high-frequency device;
a second high-frequency device electrically connected to the first high-frequency device; and
a matching circuit connected between the first high-frequency device and the second high-frequency device, wherein:
an impedance of the first high-frequency device is changed when an operating frequency of the first high-frequency device is changed,
an impedance of the second high-frequency device is changed when an operating frequency of the second high-frequency device is changed, and
the matching circuit:
is an LC π-circuit comprising at least two shunt elements and a series variable capacitor connected between the first high-frequency device and the second high-frequency device, and between the at least two shunt elements,
is capable of causing impedance characteristic to vary in accordance with an operating frequency of the matching circuit, and
adjusts to match the impedance of the first high-frequency device and the impedance of the second high-frequency device when the impedance of the first high-frequency device and the second high-frequency device are changed.

2. The high-frequency circuit according to claim 1, wherein at least one of the first high-frequency device and the second high-frequency device is a variable filter.

3. A transmission and reception circuit comprising:
two high-frequency circuits connected to the first high-frequency device, each of the high-frequency circuits being the high-frequency circuit according to claim 2,
wherein the first high-frequency device is a wide-band circulator,
wherein an antenna is connected to the first high-frequency device, and
wherein one of the high-frequency circuits functions as a transmitter circuit, and the other of the high-frequency circuits functions as a receiver circuit.

4. The transmission and reception circuit according to claim 3, comprising a second matching circuit connected in series between the antenna and the first high-frequency device.

5. The high-frequency circuit according to claim 1, wherein the first high-frequency device is a variable filter and the second high-frequency device is a power amplifier.

6. The high-frequency circuit according to claim 1, wherein a first shunt element comprises an inductor or a variable inductor connected between a first end of the series variable capacitor and ground, and a second shunt element comprises a capacitor or second variable capacitor connected between a second end of the series variable capacitor and ground.

7. The high-frequency circuit according to claim 1, wherein a first shunt element comprises a first inductor connected between a first end of the series variable capacitor and ground, and a second shunt element comprises a second inductor connected between a second end of the series variable capacitor and ground.

8. The high-frequency circuit according to claim 1, wherein the at least two shunt elements comprise a plurality of parallel inductors or a plurality of parallel capacitors, one of the plurality of parallel inductors or capacitors being selectable by a switch, wherein each of the plurality of parallel inductors has a different inductance and each of the plurality of parallel capacitors has a different capacitance.

9. The high-frequency circuit according to claim 1, wherein:
a first shunt element is connected between ground and a node between the first high-frequency device and the series variable capacitor, and
a second shunt element is connected between ground and a node between the second high-frequency device and the series variable capacitor.

10. The high-frequency circuit according to claim 9, wherein the first shunt element is a variable capacitor.

11. The high-frequency circuit according to claim 10 wherein the second shunt element is a variable coil.

12. The high-frequency circuit according to claim 9, wherein the first high-frequency device is wide-band circulator, and the second high-frequency device is a variable filter.

* * * * *